United States Patent
Uchida et al.

(10) Patent No.: US 7,807,485 B2
(45) Date of Patent: Oct. 5, 2010

(54) PROCESS FOR PRODUCING SURFACE EMITTING LASER, PROCESS FOR PRODUCING SURFACE EMITTING LASER ARRAY, AND OPTICAL APPARATUS INCLUDING SURFACE EMITTING LASER ARRAY PRODUCED BY THE PROCESS

(75) Inventors: Tatsuro Uchida, Machida (JP);
Mitsuhiro Ikuta, Kawasaki (JP);
Tetsuya Takeuchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/509,551

(22) Filed: Jul. 27, 2009

(65) Prior Publication Data
US 2010/0029030 A1    Feb. 4, 2010

(30) Foreign Application Priority Data
Jul. 31, 2008    (JP)    ............... 2008-198936

(51) Int. Cl.
*H01L 21/00*    (2006.01)
*H01S 5/00*    (2006.01)

(52) U.S. Cl. ............... 438/29; 438/31; 438/32; 372/46.013; 372/45.011; 257/E33.067; 257/E21.002

(58) Field of Classification Search ................ 438/29, 438/31, 32, 39, 584; 372/45.011, 46.013; 257/E33.067, E21.002
See application file for complete search history.

(56) References Cited

U.S. PATENT DOCUMENTS

| | | | |
|---|---|---|---|
| 5,654,228 A * | 8/1997 | Shieh et al. ................ 438/32 |
| 7,295,745 B2 | 11/2007 | Uchida ..................... 385/129 |
| 7,499,481 B2 | 3/2009 | Ikuta ...................... 372/50.124 |
| 7,535,946 B2 | 5/2009 | Nagatomo et al. ...... 372/50.124 |
| 7,539,226 B2 | 5/2009 | Uchida .................... 372/43.01 |
| 7,609,745 B2 | 10/2009 | Takeuchi .................... 372/99 |
| 2003/0026308 A1 * | 2/2003 | Iwai et al. ................... 372/46 |
| 2003/0235226 A1 | 12/2003 | Ueki ........................ 372/46 |
| 2007/0131950 A1 | 6/2007 | Takeuchi .................... 257/93 |
| 2008/0107145 A1 | 5/2008 | Hori et al. .................. 372/99 |
| 2008/0205462 A1 | 8/2008 | Uchida ...................... 372/34 |

(Continued)

FOREIGN PATENT DOCUMENTS

JP    2001-284722 A    10/2001

OTHER PUBLICATIONS

H.J. Unold et al., "Increased-area oxidised single-fundamental mode VCSEL with self-aligned shallow etched surface relief," Electronics Letters, vol. 35, No. 16, Aug. 5, 1999.

*Primary Examiner*—Walter L Lindsay, Jr.
(74) *Attorney, Agent, or Firm*—Fitzpatrick, Cella, Harper & Scinto (57) ABSTRACT

Provided is a process for producing a surface emitting laser including a surface relief structure provided on laminated semiconductor layers, including the steps of transferring, to a first dielectric film, a first pattern for defining a mesa structure and a second pattern for defining the surface relief structure in the same process; and forming a second dielectric film on the first dielectric film and a surface of the laminated semiconductor layers to which the first pattern and the second pattern have been transferred. Accordingly, a center position of the surface relief structure can be aligned with a center position of a current confinement structure at high precision.

14 Claims, 10 Drawing Sheets

U.S. PATENT DOCUMENTS

| | | | |
|---|---|---|---|
| 2008/0304532 A1 | 12/2008 | Uchida | 372/50.124 |
| 2009/0010297 A1 | 1/2009 | Uchida | 372/50.124 |
| 2009/0034572 A1 | 2/2009 | Ikuta | 372/46.013 |
| 2009/0035884 A1 | 2/2009 | Ikuta | 438/29 |
| 2009/0074026 A1 | 3/2009 | Nagatomo et al. | 372/50.124 |
| 2009/0080489 A1 | 3/2009 | Uchida et al. | 372/50.124 |
| 2009/0086786 A1 | 4/2009 | Ikuta | 372/50.12 |
| 2009/0134486 A1* | 5/2009 | Fujikata | 257/449 |
| 2009/0135872 A1 | 5/2009 | Uchida et al. | 372/44.01 |
| 2009/0135876 A1 | 5/2009 | Takeuchi et al. | 372/50.11 |
| 2009/0137076 A1* | 5/2009 | Watanabe et al. | 438/29 |
| 2009/0196318 A1* | 8/2009 | Uchida | 372/45.01 |
| 2009/0196319 A1 | 8/2009 | Hori et al. | 372/50.124 |
| 2009/0213889 A1 | 8/2009 | Takeuchi | 372/45.01 |
| 2009/0232179 A1 | 9/2009 | Ikuta | 372/50.124 |
| 2009/0262775 A1 | 10/2009 | Uchida et al. | 372/50.124 |
| 2009/0285253 A1* | 11/2009 | Masui et al. | 372/45.01 |
| 2010/0027578 A1* | 2/2010 | Takeuchi | 372/50.124 |
| 2010/0029027 A1 | 2/2010 | Ikuta et al. | 438/29 |
| 2010/0080258 A1* | 4/2010 | Ikuta | 372/46.013 |

* cited by examiner

FIG. 10B

PROCESS FOR PRODUCING SURFACE EMITTING LASER, PROCESS FOR PRODUCING SURFACE EMITTING LASER ARRAY, AND OPTICAL APPARATUS INCLUDING SURFACE EMITTING LASER ARRAY PRODUCED BY THE PROCESS

BACKGROUND OF THE INVENTION

1. Field of the Invention

The present invention relates to a process for producing a surface emitting laser, a process for producing a surface emitting laser array, and an optical apparatus including the surface emitting laser array produced by the process.

2. Description of the Related Art

A vertical cavity surface emitting laser (hereinafter referred to as VCSEL) has been known as one of surface emitting lasers.

In the surface emitting laser, an active region is sandwiched on both sides thereof by two reflectors to form a resonator in a direction perpendicular to a substrate, and light is emitted in the direction perpendicular to the substrate.

It is important for the surface emitting laser to control transverse mode oscillation. When the surface emitting laser is to be applied to communications, a transverse mode output is required to be a single-mode output.

Therefore, according to the surface emitting laser, a current confinement structure is provided in an inner portion thereof by selective oxidation to limit a light emitting region of an active layer, thereby realizing a single transverse mode.

However, when the single transverse mode is to be realized by only the current confinement structure, it is necessary to reduce the confinement diameter. When the confinement diameter reduces, the light emitting region becomes smaller, and hence it is difficult to obtain larger laser power.

Thus, up to now, there have been studied methods of introducing an intentional loss difference between a fundamental transverse mode and a high-order transverse mode to enable single-transverse mode oscillation while maintaining a light emitting region somewhat wider than in the case where the single transverse mode is realized by only the current confinement structure.

Of the methods, so-called surface relief methods are disclosed in Japanese Patent Application Laid-Open No. 2001-284722 and H. J. Unold et al., Electronics Letters, Vol. 35, No. 16 (1999).

The surface relief methods are methods of performing level difference processing for reflectance control on a surface of a surface emitting laser device, to make a high-order transverse mode loss larger than a fundamental transverse mode loss.

Herein, a level difference structure provided for reflectance control in a light output region of a light emission surface of a reflector as described above is hereinafter referred to as a surface relief structure.

Next, the surface relief structures in the conventional examples described above are described with reference to FIGS. 2A and 2B.

Figure 2A:
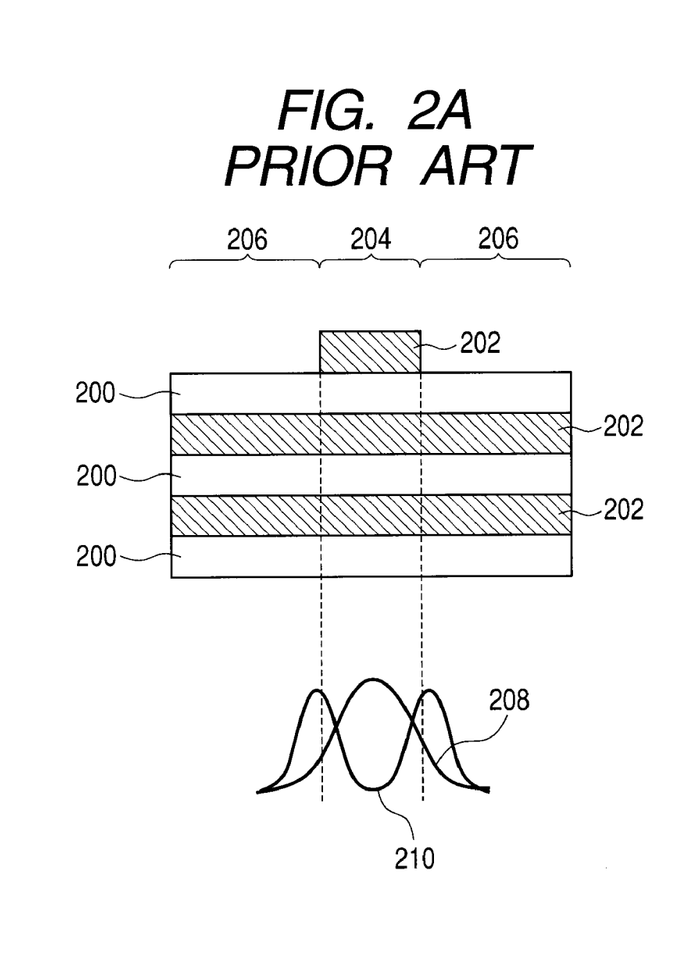
FIGS. 2A and 2B are schematic explanatory views illustrating surface relief structures in conventional examples disclosed in H. J. Unold et al., Electronics Letters, Vol. 35, No. 16 (1999) and Japanese Patent Application Laid-Open No. 2001-284722, respectively.
Figure 2B:
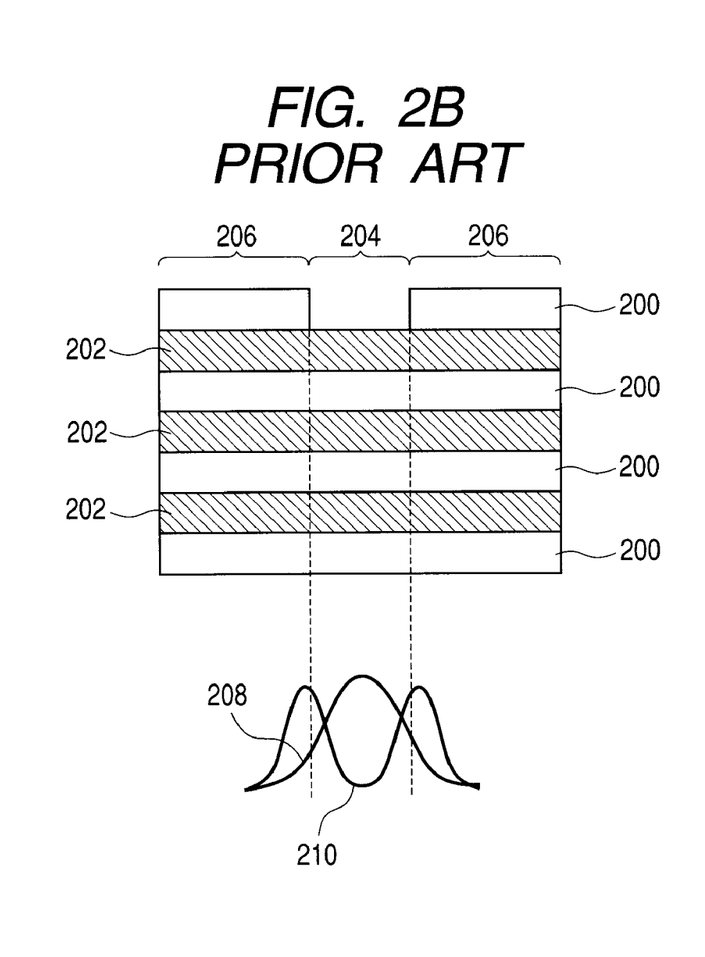

In FIGS. 2A and 2B, reference numeral 200 denotes low-refractive index layers; 202, high-refractive index layers; 204, high-reflectance regions; 206, low-reflectance regions; 208, fundamental transverse mode light distributions; and 210, high-order transverse mode light distributions.

A mirror used for the VCSEL is normally a multilayer reflector in which a low-refractive index layer and a high-refractive index layer are alternately laminated each in an optical thickness equal to ¼ of a laser oscillation wavelength λ so as to form multiple pairs.

In general, the multilayer reflector is terminated at the high-refractive index layer, and hence a high reflectance equal to or larger than 99% is obtained by the use of reflection on a final boundary with air (refractive index=1).

A convex surface relief structure illustrated in FIG. 2A is described. The convex surface relief structure is disclosed in H. J. Unold et al., Electronics Letters, Vol. 35, No. 16 (1999).

As illustrated in FIG. 2A, a part of the high-refractive index layer 202 which is a final layer in the low-reflectance region 206 is removed by a thickness equal to λ/4, and hence the multilayer reflector is terminated at the low-refractive index layer 200. Therefore, the convex surface relief structure is obtained.

According to the convex surface relief structure, a phase of a beam reflected at a boundary between the low-refractive index layer 200 and air which is bottom in refractive index than the low-refractive index layer 200 is shifted by 'π' from phases of all reflected beams of the multilayer reflector which are arranged under the low-refractive index layer 200.

As a result, the reflectance in the low-reflectance region 206 is reduced to a value equal to or smaller than 99%, and hence the reflection loss may be made higher than in the high-reflectance region 204.

In order to introduce the loss difference between the fundamental transverse mode and the high-order transverse mode based on this principle, the low-reflectance region 206 is formed in the vicinity of the light output region so that the low-reflectance region 206 largely overlaps with the high-order transverse mode light distribution 210.

In contrast, the fundamental transverse mode light distribution 208 is set so as to largely overlap with the high-reflectance region 204 in which the high-refractive index layer 202 is left as the final layer.

When the surface relief structure is formed as described above, the reflection loss in the high-order transverse mode may be increased, and hence the high-order transverse mode oscillation may be suppressed. As a result, the single-mode oscillation of only the fundamental transverse mode may be obtained.

As illustrated in FIG. 2B, when the low-refractive index layer 200 having a thickness equal to λ/4 is additionally provided on the high-refractive index layer 202 which is the final layer, the low-reflectance region 206 may be formed to obtain a concave surface relief structure. The concave surface relief structure is disclosed in Japanese Patent Application Laid-Open No. 2001-284722.

As described above, even in the case of the concave surface relief structure, the reflectance may be reduced based on the same principle as in the convex surface relief structure, and hence the single-mode oscillation of only the fundamental transverse mode may be obtained.

When the surface relief structure is to be formed, alignment between the surface relief structure and the current confinement structure in an in-plane direction is important.

That is, in order to effectively obtain the single-mode oscillation of the fundamental transverse mode, it is desirable to accurately align the surface relief structure with the current confinement structure which determines a light intensity distribution.

For example, when a central axis of the surface relief structure is shifted from a central axis of the current confinement structure, an unintended loss is introduced to a desired oscillation mode (for example, fundamental transverse mode).

In order to accurately perform the alignment, a method called a self-alignment process is disclosed in H. J. Unold et al., Electronics Letters, Vol. 35, No. 16 (1999).

This method is used to form the surface relief structure and a mesa structure with high precision through alignment patterning using the same mask.

Hereinafter, the self-alignment process disclosed in H. J. Unold et al., Electronics Letters, Vol. 35, No. 16 (1999) is described in detail with reference to FIG. 3.

Figure 3:
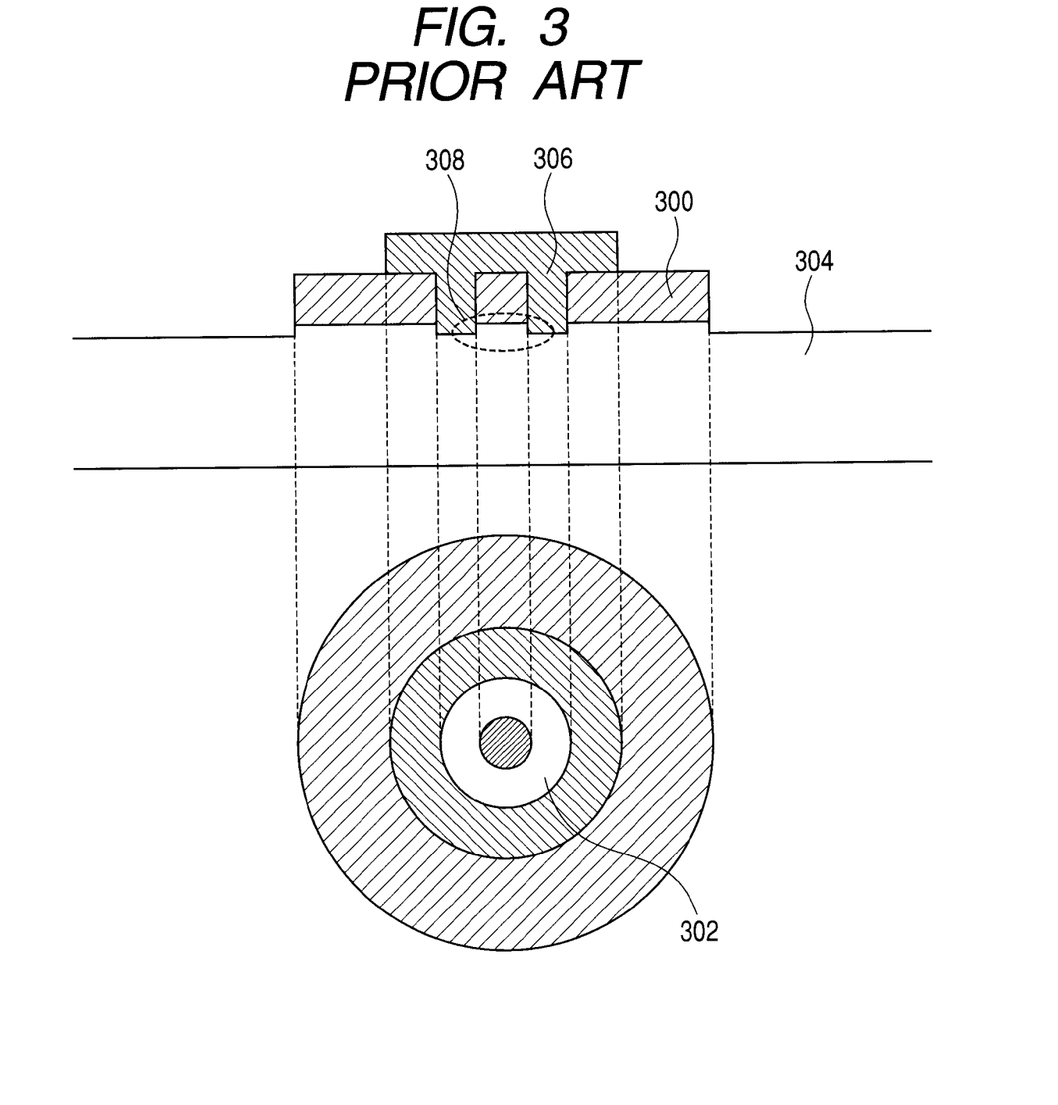
FIG. 3 is an explanatory view illustrating a self-alignment process in the conventional example disclosed in H. J. Unold et al., Electronics Letters, Vol. 35, No. 16 (1999).

As illustrated in FIG. 3, a resist is formed on a semiconductor layer 304 and patterned using photolithography to obtain a first resist pattern 300.

An outer region of the first resist pattern 300 is used as a mask for forming the mesa structure, and an inner annular pattern of the first resist pattern 300 is used as a mask for forming the surface relief structure. The shape of the first resist pattern 300 is defined by photolithography, and hence a surface relief structure 302 can be formed with high precision by the inner annular pattern.

When the mesa structure is to be formed by wet etching using the outer region of the first resist pattern 300, the mesa structure with high size precision may be obtained. Specifically, the surface relief structure 302 is formed and then a second resist pattern 306 is formed thereon as a protective layer.

After that, the mesa structure is formed using the outer region of the first resist pattern 300.

The formed mesa structure is oxidized from side surfaces thereof to form the current confinement structure.

As described above, the surface relief structure and the mesa structure can be formed with high precision through alignment patterning using the same mask. As a result, the surface relief structure and the current confinement structure which is defined by the shape of the mesa structure can be also formed with high precision.

According to the conventional production method disclosed in H. J. Unold et al., Electronics Letters, Vol. 35, No. 16 (1999), the central axis of the convex surface relief structure can be aligned with the central axis of a non-oxidized region of the current confinement structure, and hence a device capable of single-transverse mode oscillation can be manufactured.

In the production method disclosed in H. J. Unold et al., Electronics Letters, Vol. 35, No. 16 (1999), the mesa structure (trench structure) is formed by wet etching.

However, in the case where dry etching is required to form the mesa structure, because the resist has a low resistance to dry etching, a problem occurs in processing precision when the mesa structure having a certain level of height is to be formed.

In particular, in the case of a short-wavelength VCSEL (for example, 680 nm band), the number of pairs in the multilayer reflector serving as a top reflector is large. Therefore, the height of the mesa structure to be formed becomes high, and hence dry etching is used instead of wet etching. Thus, the method disclosed in H. J. Unold et al., Electronics Letters, Vol. 35, No. 16 (1999) has a problem in terms of processing precision.

SUMMARY OF THE INVENTION

The present invention has been made in view of the above-mentioned problem. An object of the present invention is to provide a surface emitting laser production process capable of aligning a surface relief structure with a current confinement structure at high precision. Another object of the present invention is to provide an optical apparatus including a surface emitting laser array produced by a surface emitting laser array production process using the surface emitting laser production process.

In an aspect of the present invention, there is provided a process for producing a surface emitting laser including a surface relief structure provided on laminated semiconductor layer, the process comprising the steps of forming a first dielectric film on the laminated semiconductor layer; transferring, to the first dielectric film, a first pattern for defining a mesa structure and a second pattern for defining the surface relief structure in the same process; transferring the first pattern and the second pattern to a surface of the laminated semiconductor layers by using the first dielectric film to which the first pattern and the second pattern have been transferred; forming a second dielectric film on the first dielectric film and the semiconductor layers to which the first pattern and the second pattern have been transferred; removing the second dielectric film which has been formed on the semiconductor layers to which the first pattern has been transferred; and forming the mesa structure at a portion where the second dielectric film has been removed.

According to the present invention, a center position of the surface relief structure may be aligned with a center position of the current confinement structure at high precision. In addition, according to the present invention, the optical apparatus including the surface emitting laser array having the surface emitting laser produced by the surface emitting laser production process can be realized.

As described above, when a mesa structure is to be formed not by wet etching but by dry etching, the mask for forming the mesa structure is provided as the resist in H. J. Unold et al., Electronics Letters, Vol. 35, No. 16 (1999). Therefore, the etching resistance is low, and hence the mesa structure cannot be formed with high shape precision.

Thus, the inventors of the present invention studied a structure in which, in order to improve the dry etching resistance, a first mask for defining the mesa structure and the surface relief structure is comprised of a dielectric film and a second mask for protecting the surface relief structure is comprised of a resist.

When the dielectric film (made of, for example, silicon oxide) serving as the first mask and the resist serving as the second mask are used to form the mesa structure by chlorine-based dry etching, the inventors of the present invention had the following problem.

That is, the resist serving as the second mask is altered by dry etching using a chlorine-based gas. In order to remove the altered resist, oxygen plasma ashing is necessary. However, the surface relief structure formed using the first mask is also etched by the oxygen plasma ashing.

Therefore, a reduction in film thickness from a design value or roughness of the surface structure occurs, and hence a sufficient loss difference cannot be provided, thereby affecting a single mode oscillation characteristic.

Thus, the inventors of the present invention found that, when the surface relief structure is protected by a second dielectric film 426 (see FIG. 5A), the damage to the surface of the surface relief structure is reduced even in a case where the oxygen plasma ashing for removing the resist is performed.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Embodiments

Embodiment 1

In Embodiment 1, a process for producing a vertical cavity surface emitting laser having a convex surface relief structure is described.

Figure 1A:
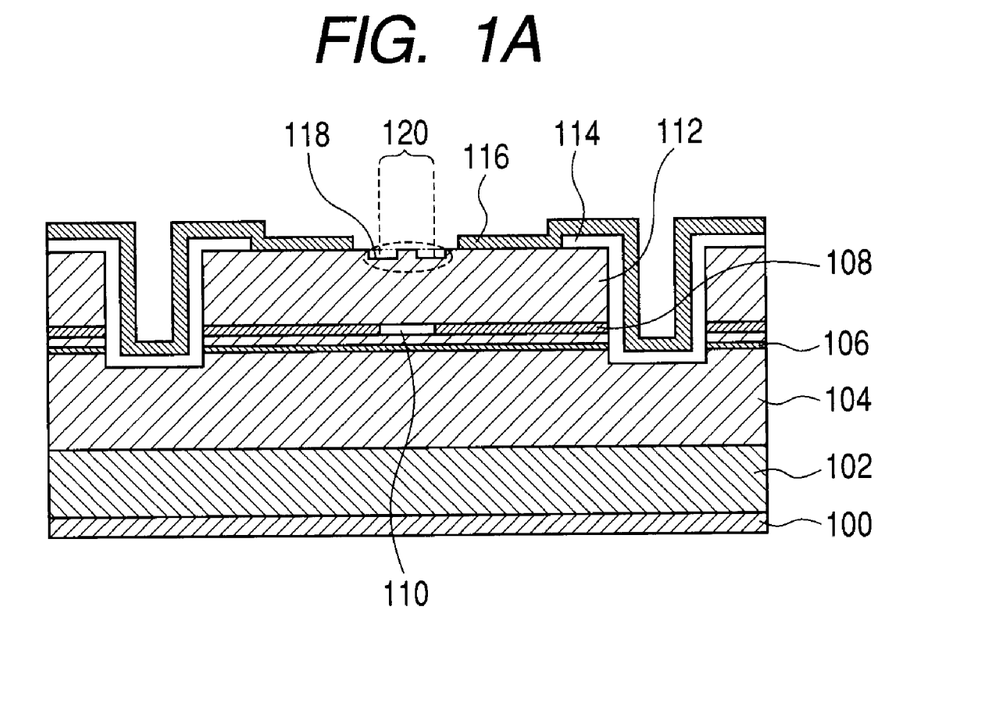
FIGS. 1A and 1B are schematic explanatory views illustrating a structure of a vertical cavity surface emitting laser according to Embodiment 1 of the present invention.
Figure 1B:
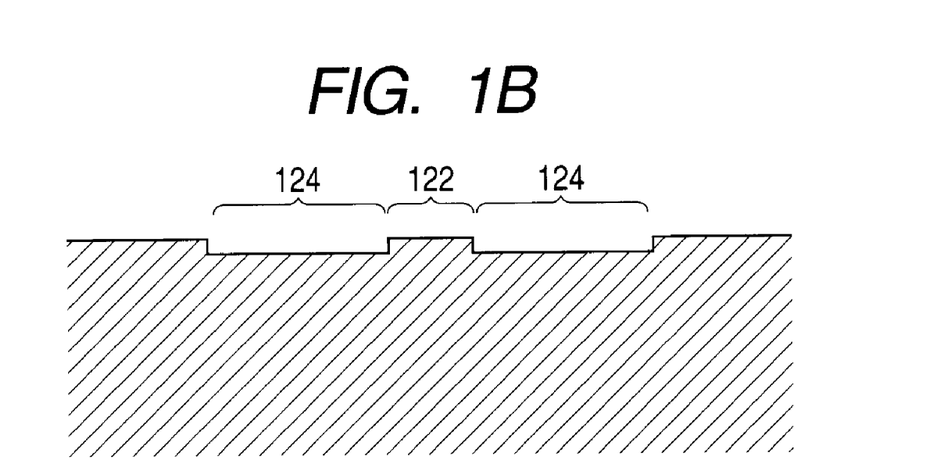

FIGS. 1A and 1B are schematic explanatory views illustrating a structure of the vertical cavity surface emitting laser in this embodiment.

FIG. 1A is a schematic cross sectional view illustrating the surface emitting laser in this embodiment. The surface emitting laser includes an n-side electrode 100, a substrate 102, a bottom distributed Bragg reflector (DBR) 104, an active layer 106, a current confinement portion (oxidized region) 108, and a non-oxidized region 110.

The surface emitting laser further includes a top DBR 112, an insulating film 114, a p-side electrode (pad electrode) 116, a surface relief structure 118, and a light output region 120.

FIG. 1B is an enlarged view illustrating the light output region 120 and the surroundings thereof. The light output region 120 includes a high-reflectance region 122 and a low-reflectance region 124.

According to the vertical cavity surface emitting laser in this embodiment, the surface relief structure and the non-oxidized region (light emitting region) of the current confinement structure (current confinement portion) are provided such that the central axes thereof coincide with a design axis. For example, the central axes thereof are aligned with each other.

For example, when the diameter of the non-oxidized region 110 is equal to or smaller than 7 μm, the high-reflectance region 122 in the surface relief structure 118 is formed such that (diameter of the high-reflectance region 122)=(half of diameter of non-oxidized region) ±1 [μm], desirably (half of diameter of non-oxidized region)±0.5 [μm]. The low-reflectance region in the surface relief structure is formed such that the width of the low-reflectance region is 3.5 μm. Therefore, high-power single-transverse mode oscillation can be realized.

That is, when the central axis of the surface relief structure is aligned with the central axis of the non-oxidized region of the current confinement structure and the relationship between the diameter of the non-oxidized region and the diameter of the high-reflectance region 122 in the surface relief structure is suitably set, high-power single-transverse mode oscillation of the fundamental mode can be realized.

Next, the process for producing the surface emitting laser according to this embodiment is described.

FIGS. 4A to 4F, 5A to 5F, and 6A to 6D are explanatory views illustrating the process for producing the vertical cavity surface emitting laser according to this embodiment.

Figure 4A:
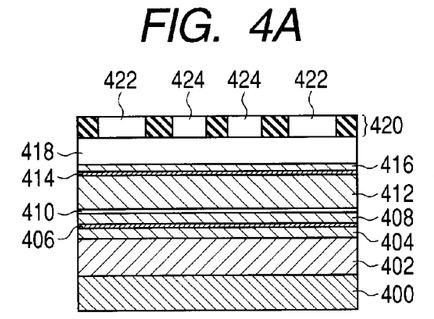
FIGS. 4A, 4B, 4C, 4D, 4E and 4F are explanatory views illustrating a process for producing the vertical cavity surface emitting laser according to Embodiment 1 of the present invention.

As illustrated in FIG. 4A, multiple semiconductor layers including a bottom reflector, an active layer, a selective oxidation layer (current confinement layer), and a top reflector are sequentially laminated on the substrate.

Specifically, a metal organic chemical vapor deposition (MOCVD) crystal growth technique is used. A bottom n-type DBR layer 402 of $Al_{0.9}Ga_{0.1}As/Al_{0.5}Ga_{0.5}As$ is grown on an n-type GaAs substrate 400 through a buffer layer (not shown).

An n-type spacer layer 404 of AlGaInP and a multi-quantum well (MQW) active layer 406 of GaInP/AlGaInP are sequentially grown on the bottom n-type DBR layer 402.

Then, a p-type spacer layer 408 of AlGaInP and a p-type selective oxidation layer 410 of $Al_{0.98}Ga_{0.02}As$ are grown on the active layer 406.

A top p-type DBR layer 412 of $Al_{0.9}Ga_{0.1}As/Al_{0.5}Ga_{0.5}As$, a p-type etching stop layer 414 of AlInGaP, and a p-type GaAs contact layer/p-type AlGaAs layer 416 are sequentially grown on the selective oxidation layer 410.

A first dielectric film 418 is formed above the laminated semiconductor layers. The first dielectric film 418 serves as a mask for forming a mesa structure through etching, as described below. Thus, when designing the top reflector so as to have a large thickness, it is necessary to form the first dielectric film 418 so as to have a large thickness as well. For example, the first dielectric film 418 is formed to have a thickness of 1 μm.

Silicon oxide, silicon nitride, silicon oxynitride or the like may be used as a material of the first dielectric film 418.

Subsequently, a first resist pattern 420 is formed on the first dielectric film 418 by a lithography technique.

Figure 7A:
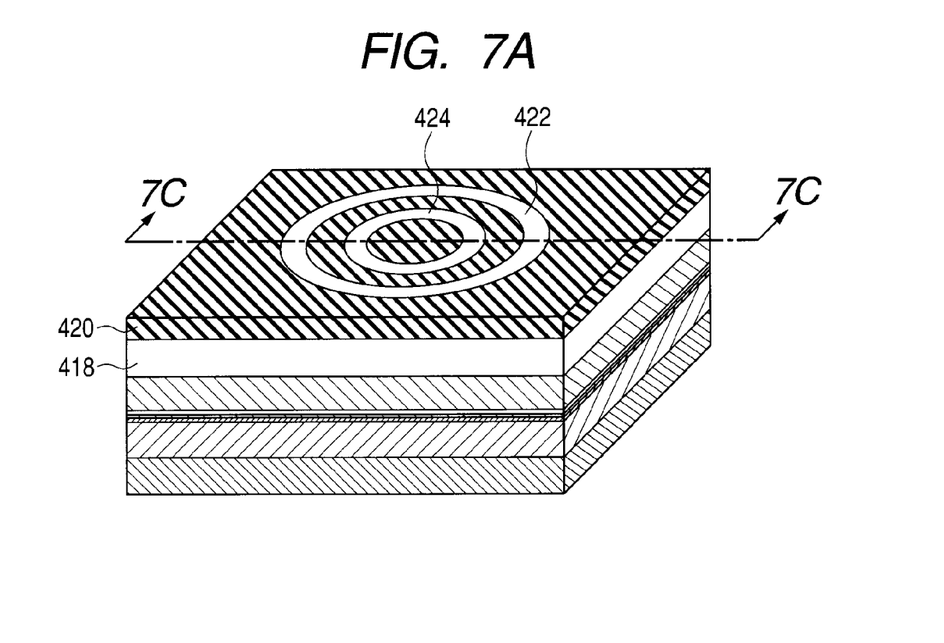
FIGS. 7A, 7B and 7C are schematic views illustrating a first resist pattern formed during the process for producing the vertical cavity surface emitting laser according to Embodiment 1 of the present invention.
Figure 7B:
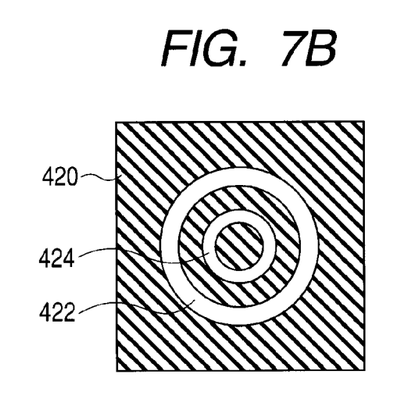
Figure 7C:
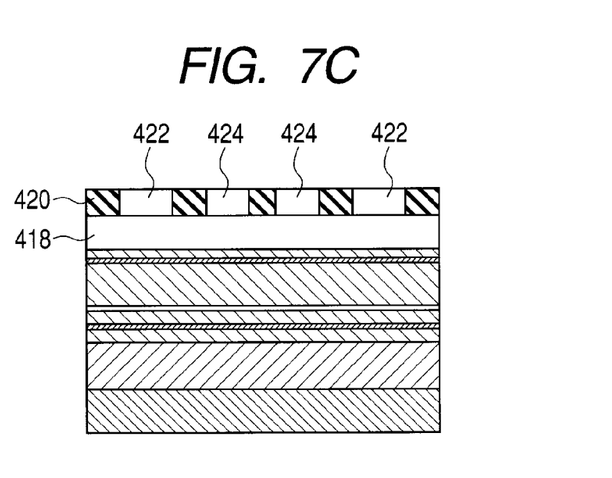

FIGS. 7A to 7C are schematic views illustrating the first resist pattern 420 formed as described above. FIG. 7A is a perspective view, FIG. 7B is a plan view, and FIG. 7C is a cross sectional view along the line 7C-7C of FIG. 7A. As illustrated in FIGS. 7A to 7C, the first resist pattern 420 is formed on the first dielectric film 418 to provide annular opening patterns (first pattern 422 and second pattern 424) which have substantially the same central axis and are different in size from each other.

The small circular annular opening pattern (second pattern 424) is a pattern for defining the surface relief structure which is a level difference structure. The large circular annular opening pattern (first pattern 422) is a pattern for defining a diameter of the mesa structure.

As described above, the first and second patterns are formed on the first dielectric film 418 at the same time by the lithography technique, and hence the surface relief structure and the mesa structure can be manufactured with high position precision. As a result, a positional relationship between the oxidized confinement structure and the surface relief structure can be set with high precision.

As illustrated in FIGS. 7A to 7C, the first pattern 422 and the second pattern 424 are provided as the two large and small concentric circular annular patterns having different diameters. However, the present invention is not limited to such patterns.

For example, two large and small concentric square annular patterns having different side lengths may be provided instead of the two large and small concentric circular annular patterns.

Figure 4B:
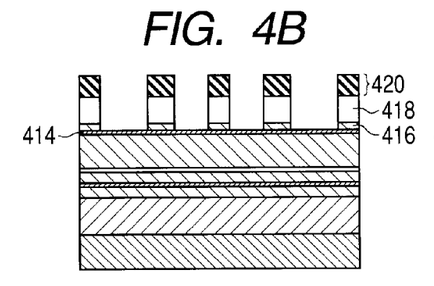

Next, as illustrated in FIG. 4B, the first resist pattern 420 is transferred to the first dielectric film 418 by wet etching using buffered hydrogen fluoride (BHF).

This transfer may be performed by dry etching instead of wet etching.

In this case, the transfer may be performed such that the first pattern and the second pattern which are the two large and small circular annular opening patterns having the same central axis are formed on the first dielectric film 418.

After the wet etching using buffered hydrogen fluoride, the first resist pattern 420 is removed.

After the removal of the first resist pattern 420, the first dielectric film 418 including the first pattern 422 and the second pattern 424 is used as a mask to transfer a pattern to the p-type GaAs contact layer/p-type AlGaAs layer 416 by wet etching.

Specifically, the etching stop layer 414 (for example, AlGaInP layer) having a thickness of 10 nm is introduced in advance at a distance of $\lambda/4n$ from an uppermost surface.

The p-type GaAs contact layer/p-type AlGaAs layer 416 having a thickness of $\lambda/4n$ is selectively removed from the uppermost surface by wet etching using a phosphoric acid based etchant. In this case, the etching depth is set to, for example, $\lambda/4n$. Note that $\lambda$ denotes an oscillation wavelength and n denotes a refractive index of a semiconductor layer to be etched.

Therefore, the surface relief structure is formed.

The etching stop layer 414 can selectively stop etching, and hence the etching depth can be accurately controlled. The etching depth may be adjusted by time control without using the etching stop layer.

Wet etching is desirable in view of the influence of damage on the surface. However, dry etching may be performed.

Figure 4C:
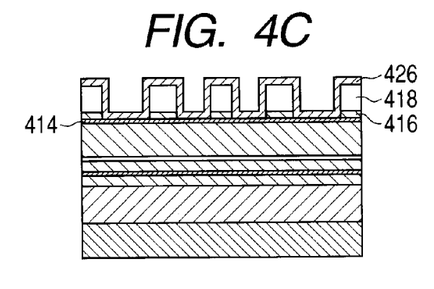

Next, as illustrated in FIG. 4C, a second dielectric film 426 is formed by a CVD film deposition technique on the laminated semiconductor layers including the first dielectric film 418 in which the first pattern 422 and the second pattern 424 are provided. The second dielectric film 426 is a layer for protecting the surface relief structure and is formed, for example, to 230 nm. Examples of the second dielectric film 426 include a silicon oxide film, a silicon nitride film, and a silicon oxynitride film.

As described above, in this embodiment, the surface relief structure is protected by the second dielectric film 426. Therefore, even when oxygen plasma ashing for removing a resist is performed in a subsequent step (FIG. 5A), the damage to the surface of the surface relief structure may be prevented. In this step, the second dielectric film 426 is formed so as to cover the first pattern 422 provided in the first dielectric film 418, and hence the pattern shape determined by photolithography is changed.

However, the second dielectric film 426 is formed using, for example, a plasma CVD method, and hence the second dielectric film 426 is deposited in a uniform thickness on side walls of the first pattern 422 provided in the first dielectric film 418.

Therefore, the width of the first pattern 422 for defining the mesa structure narrows. However, the second dielectric film 426 having the uniform thickness is isotropically formed. Thus, it is unlikely to cause trouble by dry etching during the formation of the mesa structure in a later step (FIG. 4F).

Figure 4D:
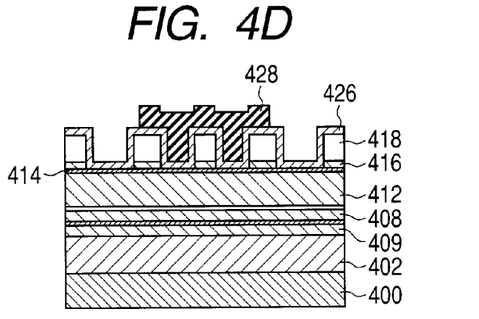

Next, as illustrated in FIG. 4D, a second resist pattern 428 is formed by a lithography technique.

In this case, the second resist pattern 428 is formed so as to cover the second pattern 424 provided with the second dielectric film 426.

Figure 4E:
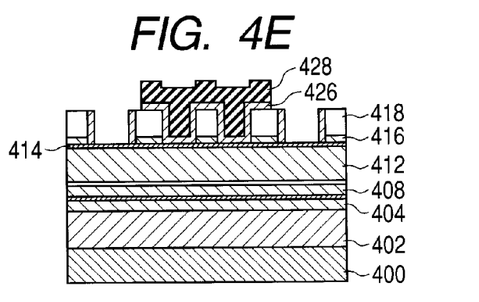
Figure 4F:
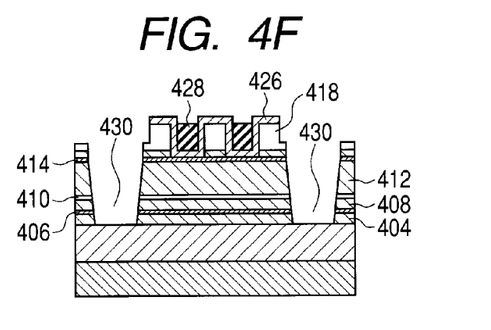

Next, as illustrated in FIG. 4E, the second resist pattern 428 is used as a mask to remove a portion of the second dielectric film 426 by wet etching using buffered hydrogen fluoride. The second dielectric film 426 is a layer for protecting the surface relief structure and is desirably so formed as to have a thickness that is smaller than that of the first dielectric film 418. If it is formed to have a large thickness, a long etching time is required in removing part of the second dielectric film 426, thereby increasing the amount of side etching for the first dielectric film 418. As a result, the initial design values may not be achieved.

Next, as illustrated in FIG. 4F, a trench 430 is formed by dry etching to expose the bottom n-type DBR layer 402, thereby manufacturing the post of the mesa structure. The second resist pattern 428 formed on the second pattern 424 that defines the surface relief structure is desirably so formed as to remain after the dry etching. This is because if the resist does not remain, the second dielectric film 426 is removed during the dry etching, which may damage the previously formed surface relief structure.

In FIG. 4F, dry etching is performed until the bottom n-type DBR layer 402 is exposed. However, it is sufficient that etching is performed until the selective oxidation layer 410 for forming the current confinement structure is exposed. Therefore, dry etching is not necessarily performed until the bottom n-type DBR layer 402 is exposed.

Figure 5A:
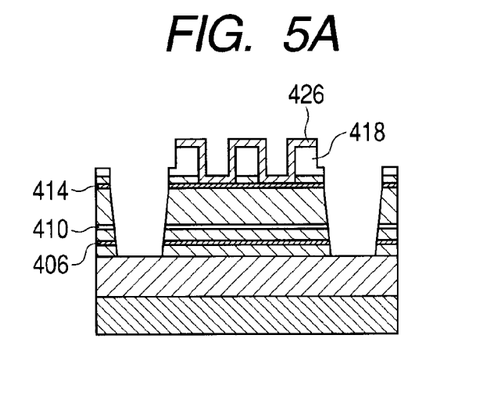
FIGS. 5A, 5B, 5C, 5D, 5E and 5F are explanatory views illustrating the process for producing the vertical cavity surface emitting laser according to Embodiment 1 of the present invention.

Next, as illustrated in FIG. 5A, the second resist pattern 428 is removed by an oxygen plasma ashing technique.

In this case, the surface relief structure is protected by the second dielectric film 426, and hence the damage to the surface of the surface relief structure can be prevented.

Figure 5B:
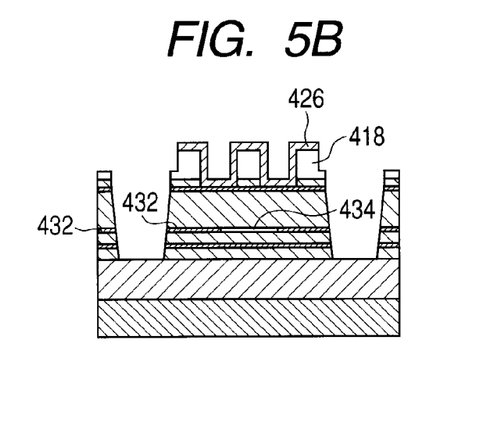

Next, as illustrated in FIG. 5B, the p-type selective oxidation layer 410 of $Al_{0.98}Ga_{0.02}As$ is selectively oxidized, for example, in a water-vapor atmosphere at a substrate temperature of 450° C., to form the current confinement structure (oxidized region 432 and non-oxidized region 434).

In this case, the surfaces of the laminated semiconductor layers other than the trench 430 are covered with one of the first dielectric film 418 and the second dielectric film 426, and hence the surfaces of the laminated semiconductor layers can be protected against oxidization.

Figure 6A:
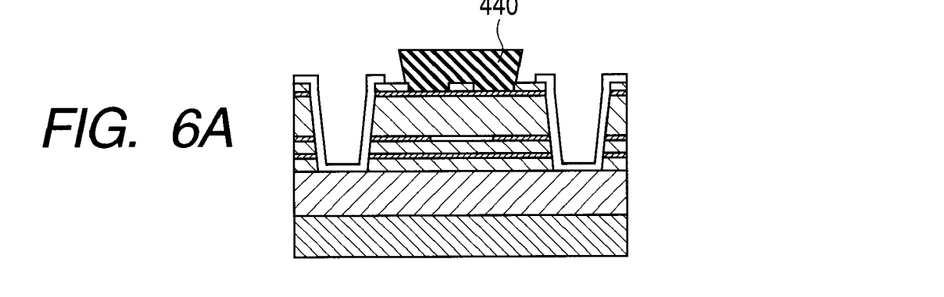
FIGS. 6A, 6B, 6C and 6D are explanatory views illustrating the process for producing the vertical cavity surface emitting laser according to Embodiment 1 of the present invention.
Figure 6B:
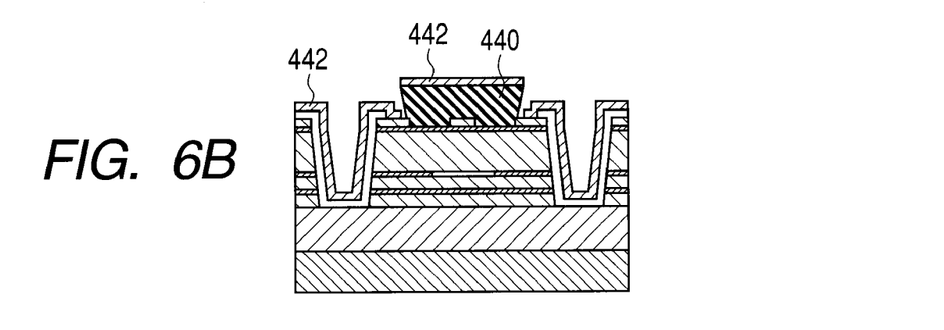
Figure 6C:
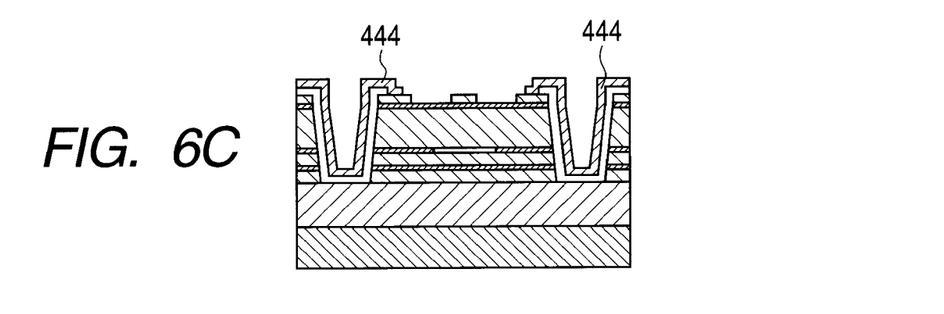

Therefore, electrodes may be formed with an excellent contact resistance state in a subsequent step (FIG. 6C).

Figure 5C:
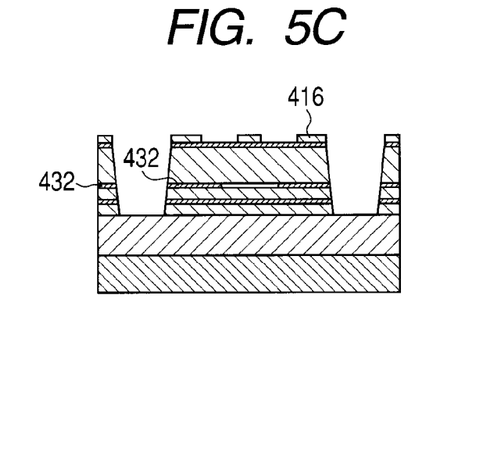

Next, as illustrated in FIG. 5C, the second dielectric film 426 and the first dielectric film 418 are removed by wet etching using buffered hydrogen fluoride.

In this embodiment, the second dielectric film 426 and the first dielectric film 418 are completely removed. However, the second dielectric film 426 and the first dielectric film 418 are not necessarily removed and may be both left.

Alternatively, the second dielectric film 426 may be left only on the surface relief structure.

For example, when the following relationship is satisfied (where film thickness of the second dielectric film 426 is expressed by d), $$d=(N\lambda)/2n_d$$

reflectance is not reduced even in the case where the second dielectric film 426 is left on the surface relief structure. Note that λ denotes oscillation wavelength, $n_d$ denotes refractive index of the second dielectric film, and N denotes a natural number equal to or larger than 1.

Figure 5D:
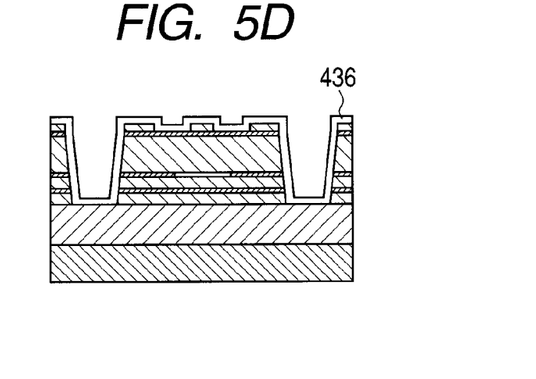

Next, as illustrated in FIG. 5D, an insulating film 436 made of silicon oxide is formed by a CVD film formation technique so as to cover the entire surface of the device.

Figure 5E:
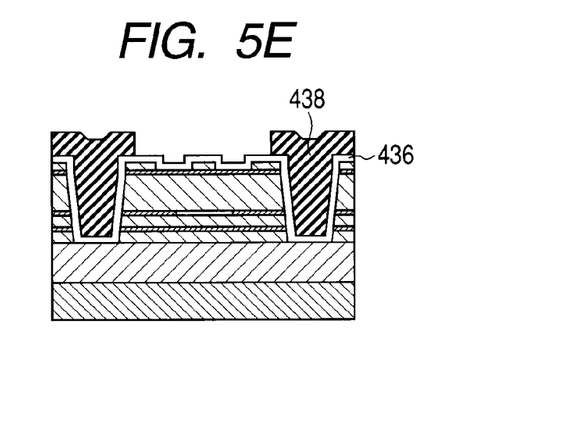

Next, as illustrated in FIG. 5E, a third resist pattern 438 is formed by a lithography technique.

Figure 5F:
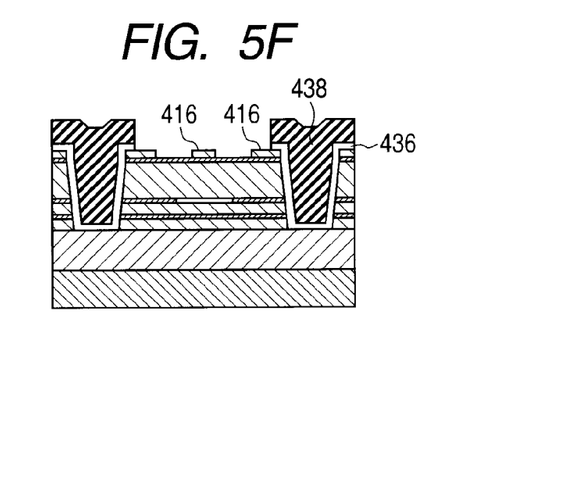

Next, as illustrated in FIG. 5F, the insulating film 436 is removed by wet etching using buffered hydrogen fluoride to expose the p-type GaAs contact layer/p-type AlGaAs layer 416 to which the first pattern is transferred.

In this embodiment, the insulating film 436 is completely removed. However, it is not always necessary to remove the insulating film 436. The insulating film 436 may be left in a light output region (including the surface relief structure) for surface protection. For example, when the following relationship is satisfied (where film thickness of the insulating film 436 is expressed by a), $$a=(N\lambda)/2n_a$$

reflectance is not reduced even in the case where the insulating film 436 is left on the surface relief structure. Note that λ denotes oscillation wavelength, $n_a$ denotes refractive index of the insulating film, and N denotes a natural number equal to or larger than 1.

After that, the third resist pattern 438 is removed.

Next, as illustrated in FIG. 6A, a fourth resist pattern 440 is formed by a lithography technique to cover the light output region.

Next, as illustrated in FIG. 6B, a metal film 442 made of Ti/Au is deposited on a surface including the fourth resist pattern 440 by a metal deposition technique.

Next, as illustrated in FIG. 6C, pad electrodes 444 are formed by a liftoff technique to expose the light output region.

Figure 6D:
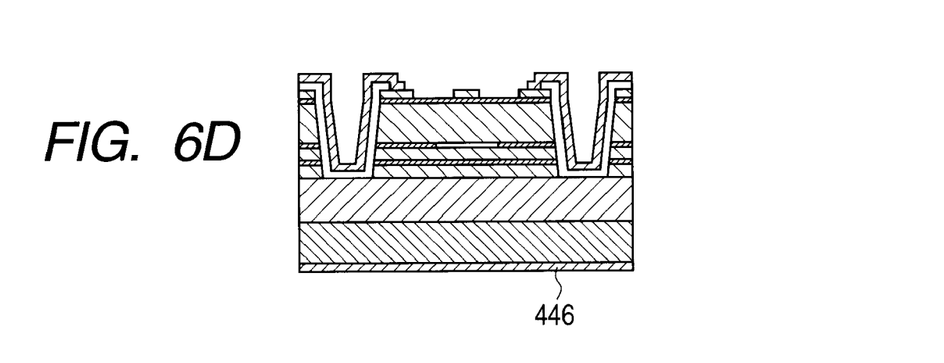

Next, as illustrated in FIG. 6D, an n-side electrode (AuGe/Ni/Au) 446 is formed on a back surface of the n-type GaAs substrate 400 by a metal deposition technique.

According to the process described above in this embodiment, the photolithography technique with high position precision is used to form the two large and small circular annular opening patterns whose central axes are aligned with each other.

The surface relief structure having a controlled reflectance is defined by the small circular annular opening pattern. The diameter of the mesa structure is defined by the large circular annular opening pattern to define the non-oxidized region of the current confinement structure.

Therefore, the central axis of the surface relief structure and the central axis of the non-oxidized region of the current confinement structure can be controlled with high position precision.

When the large circular annular opening pattern is used to form the mesa structure by dry etching, the surface relief structure provided in the small circular annular opening pattern is protected by the dielectric film and the resist, and hence the surface relief structure is not exposed to the outside.

Even in the case of the removal of the resist after the dry etching, the surface relief structure is protected by the dielectric film, and hence the surface relief structure is not exposed.

In this embodiment, the 680 nm band surface emitting laser is described. However, the present invention is not limited to this and may be applied to, for example, an 850 nm band (GaAs/AlGaAs active layer system) surface emitting laser.

Processes (apparatuses) used for growth, lithography, etching, ashing, and vapor deposition in this embodiment are not limited to the described processes (apparatuses). When the same effects are obtained, any process (apparatus) may be employed.

In this embodiment, the process for producing the surface emitting laser of a single device is described. When multiple surface emitting lasers, each of which is the surface emitting laser of a single device, are arranged in array, the producing process described above may be applied.

Embodiment 2

In Embodiment 2, a process for producing a vertical cavity surface emitting laser having a concave surface relief structure is described.

Figure 8A:
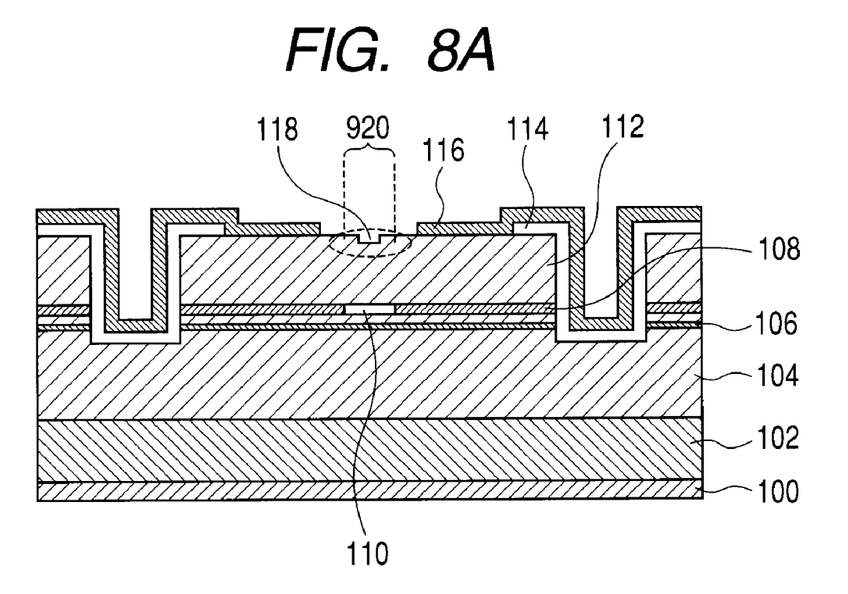
FIGS. 8A and 8B are schematic explanatory views illustrating a structure of a vertical cavity surface emitting laser according to Embodiment 2 of the present invention.
Figure 8B:
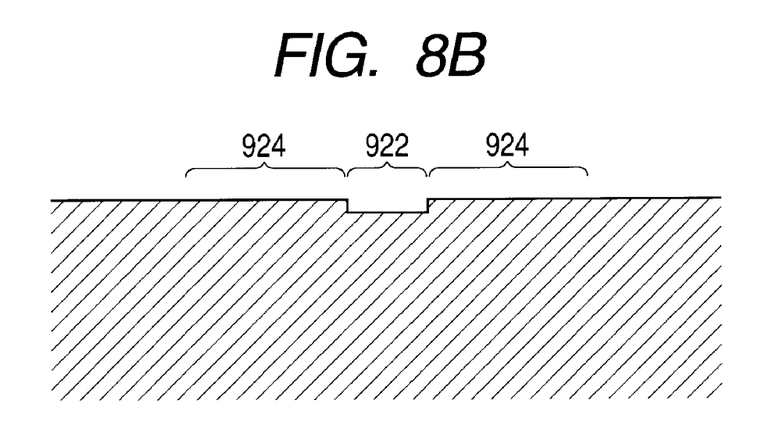

FIGS. 8A and 8B are schematic explanatory views illustrating a structure of the vertical cavity surface emitting laser in this embodiment.

FIG. 8A is a schematic explanatory cross sectional view illustrating a light output region 920. FIG. 8B is an enlarged view illustrating the light output region 920.

In FIGS. 8A and 8B, the same constituent elements as in Embodiment 1 illustrated in FIGS. 1A and 1B are expressed by the same reference numerals, and hence the duplicated descriptions are omitted.

In Embodiment 1, a high-reflectance region 922 is convex. In contrast, a low-reflectance region 924 is convex in this embodiment, and hence a concave surface relief structure is formed.

Next, the process for producing the surface emitting laser according to this embodiment is described.

A difference from the producing process according to Embodiment 1 is the second pattern of the first resist pattern. The other steps are the same as in Embodiment 1.

Figure 9A:
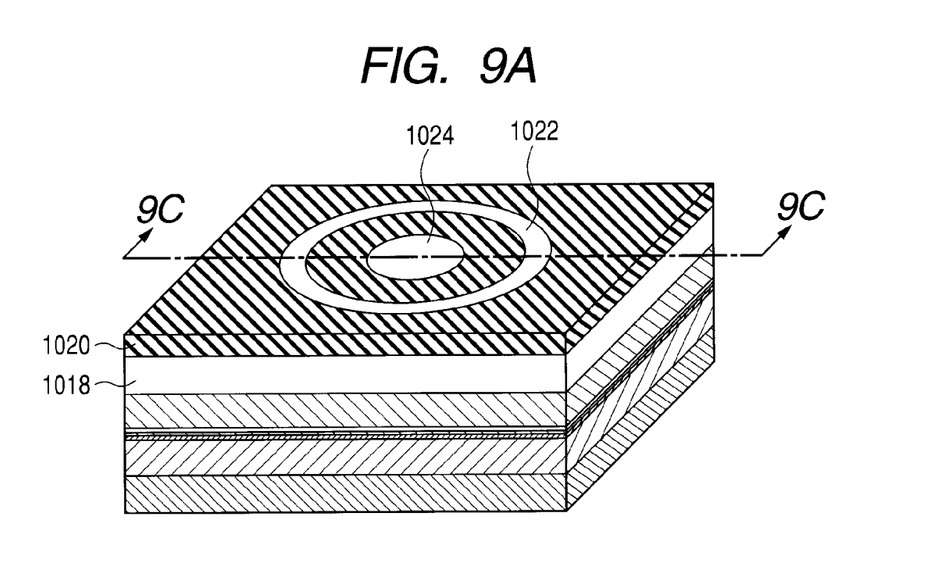
FIGS. 9A, 9B and 9C are schematic views illustrating a first resist pattern formed during a process for producing the vertical cavity surface emitting laser according to Embodiment 2 of the present invention.
Figure 9B:
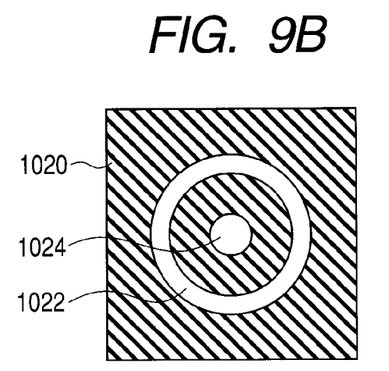
Figure 9C:
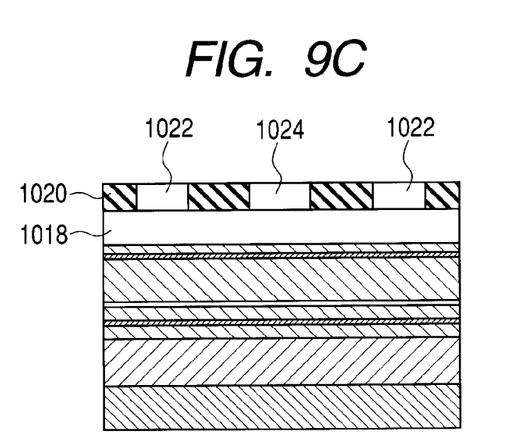

FIGS. 9A to 9C are schematic explanatory views illustrating a first resist pattern formed during the process for producing the surface emitting laser according to Embodiment 2 of the present invention, which is different from the first resist pattern (FIGS. 7A to 7C) in Embodiment 1.

FIG. 9A is a perspective view, FIG. 9B is a plan view, and FIG. 9C is a cross sectional view along the line 9C-9C of FIG. 9A. As illustrated in FIGS. 9A to 9C, a first resist pattern 1020 is formed on a first dielectric film 1018 and has a first pattern 1022 and a second pattern 1024.

As illustrated in FIGS. 9A to 9C, the first resist pattern 1020 is formed on the first dielectric film 1018 to provide large and small opening patterns (first pattern 1022 and second pattern 1024) which have the same central axis and are different in shape from each other.

The first pattern 1022 is a pattern for forming the mesa structure. The second pattern 1024 is a pattern for forming the surface relief structure.

As illustrated in FIGS. 9A to 9C, the patterns which have the same central axis and are different in shape from each other are provided as a circular annular opening pattern having a large diameter and a circular opening pattern having a small diameter. However, the present invention is not limited to such patterns.

For example, the circular annular opening pattern having the large diameter may be a square annular opening pattern.

Embodiment 3

In Embodiment 3, a structural example of an optical apparatus using the vertical cavity surface emitting laser produced by the producing process according to any one of the embodiments described above is described.

A structural example of an image forming apparatus including a laser array using the surface emitting lasers is described as the optical apparatus.

Figure 10A:
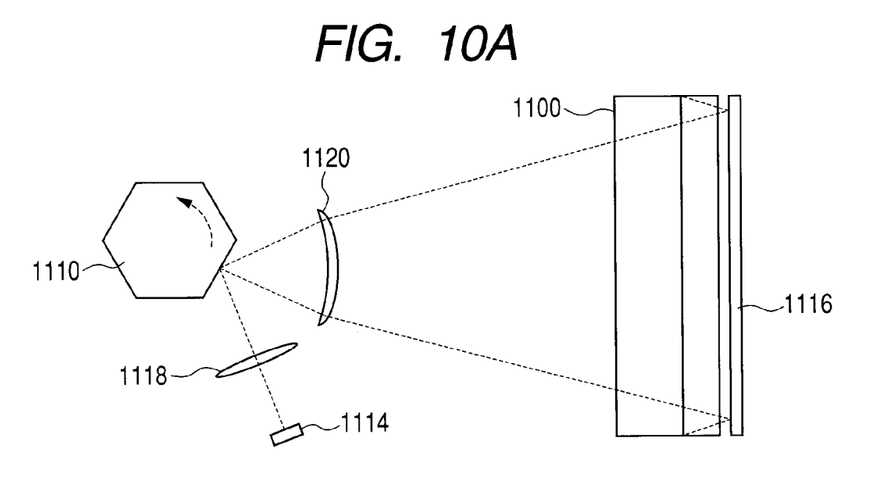
FIGS. 10A and 10B are schematic explanatory views illustrating an electrophotographic recording type image forming apparatus including a laser array using the vertical cavity surface emitting laser, according to Embodiment 3 of the present invention.
Figure 10B:
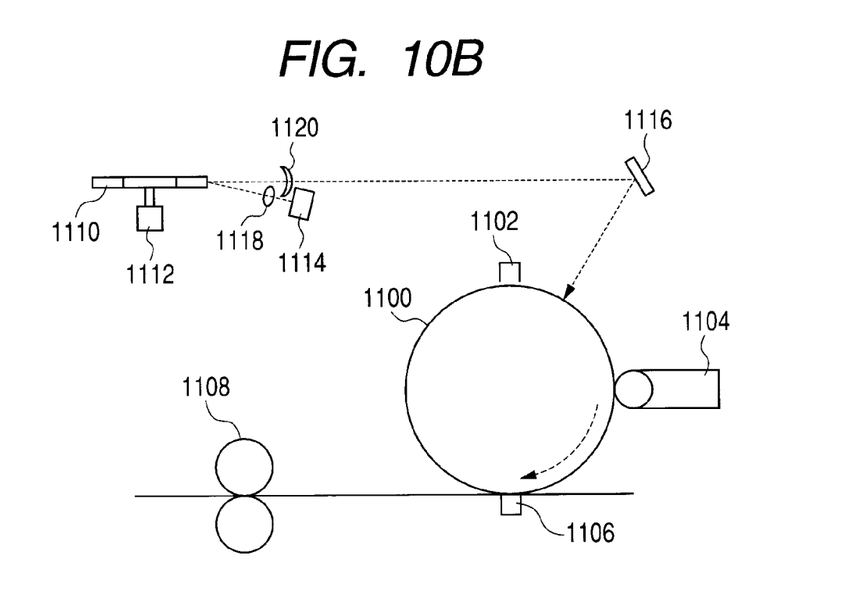

FIGS. 10A and 10B are schematic explanatory views illustrating an electrophotographic recording type image forming apparatus in which the laser array using the vertical cavity surface emitting lasers is mounted, according to this embodiment.

FIG. 10A is a plan view illustrating the image forming apparatus and FIG. 10B is a side view illustrating the image forming apparatus. In FIGS. 10A and 10B, the image forming apparatus includes a photosensitive drum (photoreceptor) 1100, a charging unit 1102, a developing unit 1104, a transfer charging unit 1106, a fixing unit 1108, a rotatable polygon mirror 1110, and a motor 1112. The image forming apparatus further includes a surface emitting laser array 1114, a reflector 1116, a collimator lens 1118, and an f-θ lens 1120.

In this embodiment, the rotatable polygon mirror 1110 is driven to rotate by the motor 1112 illustrated in FIG. 10B.

The surface emitting laser array 1114 serves as a light source for recording and is turned on or off by a laser driver (not shown) based on an image signal.

An optically modulated laser beam is emitted from the surface emitting laser array 1114 to the rotatable polygon mirror 1110 through the collimator lens 1118.

The rotatable polygon mirror 1110 is rotating in a direction indicated by the arrow. The laser beam output from the surface emitting laser array 1114 is reflected on a reflecting surface of the rotatable polygon mirror 1110 as a deflection beam whose emission angle is continuously changed according to the rotation of the rotatable polygon mirror 1110.

The reflected laser beam is subjected to distortion correction or the like by the f-θ lens 1120. Then, the photosensitive drum 1100 is irradiated with the laser beam through the reflector 1116 and scanned therewith in the main scanning direction. In this case, a multiple-line image corresponding to the surface emitting laser array 1114 is formed in the main scanning direction of the photosensitive drum 1100 by a laser beam reflected on a surface of the rotatable polygon mirror 1110.

In this embodiment, the 4×8 surface emitting laser array 1114 is used, and hence a 32-line image is formed.

The photosensitive drum 1100 is charged in advance by the charging unit 1102 and continuously exposed by the scanning of the laser beam to form an electrostatic latent image.

The photosensitive drum 1100 is rotating in a direction indicated by the arrow. The formed electrostatic latent image is developed by the developing unit 1104. A visible image obtained by development is transferred to a transfer paper by the transfer charging unit 1106.

The transfer paper to which the visible image is transferred is transported to the fixing unit 1108 and fixed thereby, and then delivered to the outside of the apparatus.

The structural example of the image forming apparatus is described as the optical apparatus. However, the present invention is not limited to the structural example.

For example, an optical apparatus such as a projection display may be provided, in which a light source including the vertical cavity surface emitting laser according to the present invention is used and a beam from the light source is made incident on an image display member to display an image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-198936, filed Jul. 31, 2008, which is hereby incorporated by reference herein in its entirety.

What is claimed is:

1. A process for producing a surface emitting laser including a surface relief structure provided on laminated semiconductor layer, the process comprising the steps of:
    forming a first dielectric film on the laminated semiconductor layer;
    transferring, to the first dielectric film, a first pattern for defining a mesa structure and a second pattern for defining the surface relief structure in the same process;
    transferring the first pattern and the second pattern to a surface of the laminated semiconductor layers by using the first dielectric film to which the first pattern and the second pattern have been transferred;
    forming a second dielectric film on the first dielectric film and the semiconductor layers to which the first pattern and the second pattern have been transferred;
    removing the second dielectric film which has been formed on the semiconductor layers to which the first pattern has been transferred; and
    forming the mesa structure at a portion where the second dielectric film has been removed.

2. A process according to claim 1, further comprising the step of forming a resist on the first dielectric film to which the second pattern has been transferred after the step of forming a second dielectric film and before the step of removing the second dielectric film.

3. A process according to claim 1, further comprising the step of forming a current confinement structure by selectively oxidizing some of the semiconductor layers after the step of forming the mesa structure.

4. A process according to claim 3, further comprising the step of removing the first dielectric film and the second dielectric film after the step of forming the current confinement structure.

5. A process according to claim 1, further comprising the step of removing the first dielectric film so as to leave the second dielectric film on the semiconductor layers to which the second pattern has been transferred after the step of forming the mesa structure,
    wherein the following relationship is satisfied to produce the surface emitting laser $$d = (N\lambda)/(2n_d)$$

where d indicates film thickness of the second dielectric film, N indicates a natural number equal to or larger than 1, λ indicates oscillation wavelength, and $n_d$ indicates refractive index of the second dielectric film.

6. A process according to claim 1, wherein the step of forming the mesa structure is performed by dry etching.

7. A process according to claim 1, wherein one of the first dielectric film and the second dielectric film is formed of a material selected from the group consisting of silicon oxide, silicon nitride, and silicon oxynitride.

8. A process according to claim 1, wherein: each of the first pattern and the second pattern is a concentric circular annular opening pattern, the first pattern having a diameter larger than that of the second pattern.

9. A process according to claim 1, wherein the first pattern is a concentric circular annular opening pattern; and the second pattern is a circular opening pattern having a smaller diameter than the first pattern.

10. A process according to claim 1, wherein the first pattern is a concentric square annular opening pattern having a longer side length than the second pattern.

11. A process according to claim 1, wherein the first pattern is a concentric square annular opening pattern; and the second pattern is a circular opening pattern having a smaller diameter than the first pattern.

12. A process according to claim 1, wherein a central axis of the first pattern is aligned with a central axis of the second pattern.

13. A process for producing a surface emitting laser array, the process comprising arranging a plurality of surface emitting lasers produced by the process according to claim 1.

14. A process for producing a surface emitting laser in which multiple semiconductor layers including a bottom reflector, an active layer, a current confinement layer, and a top reflector are laminated on a substrate in the stated order, and a surface relief structure which is a level difference structure for controlling reflectance is provided on the laminated multiple semiconductor layers, the process comprising the steps of:

forming a first dielectric film on the laminated multiple semiconductor layers;

forming, on the first dielectric film, a first resist pattern including a first pattern for defining a mesa structure and a second pattern for defining the surface relief structure;

transferring the first pattern and the second pattern to the first dielectric film by using the first resist pattern;

removing the first resist pattern after the first pattern and the second pattern are transferred and transferring the first pattern and the second pattern to a surface of the laminated multiple semiconductor layers by using the first dielectric film to which the first pattern and the second pattern have been transferred;

forming a second dielectric film on the semiconductor layers including the first dielectric film to which the first pattern and the second pattern have been transferred;

forming a second resist pattern in a region where the second dielectric film is formed on the semiconductor layers to which the second pattern has been transferred;

removing the second dielectric film formed on the semiconductor layers in a region where the first pattern has been transferred, by using the second resist pattern;

removing the laminated multiple semiconductor layers in the region where the first pattern has been transferred by using the second resist pattern and the second dielectric film including the first dielectric film on the semiconductor layers to which the second pattern has been transferred, after the second dielectric film is removed, thereby forming the mesa structure; and removing the second resist pattern after the mesa structure is formed.

* * * * *